(12) United States Patent
Kasahara

(10) Patent No.: US 8,298,839 B2
(45) Date of Patent: Oct. 30, 2012

(54) MANUFACTURING METHOD OF A THIN FILM ACTIVE ELEMENT

(75) Inventor: Kenji Kasahara, Niihama (JP)

(73) Assignee: Sumitomo Chemical Company, Limited, Tokyo (JP)

(*) Notice: Subject to any disclaimer, the term of this patent is extended or adjusted under 35 U.S.C. 154(b) by 304 days.

(21) Appl. No.: 12/681,995

(22) PCT Filed: Oct. 9, 2008

(86) PCT No.: PCT/JP2008/068810
§ 371 (c)(1),
(2), (4) Date: Apr. 7, 2010

(87) PCT Pub. No.: WO2009/048167
PCT Pub. Date: Apr. 16, 2009

(65) Prior Publication Data
US 2010/0207113 A1 Aug. 19, 2010

(30) Foreign Application Priority Data
Oct. 11, 2007 (JP) ................. 2007-265860

(51) Int. Cl.
*H01L 51/56* (2006.01)
*H01L 51/40* (2006.01)

(52) U.S. Cl. ........... 438/22; 257/40; 257/79; 257/91; 257/E51.022; 438/34

(58) Field of Classification Search ........... 438/22, 438/34, 35
See application file for complete search history.

(56) References Cited

U.S. PATENT DOCUMENTS

| | | | |
|---|---|---|---|
| 5,733,804 A * | 3/1998 | Hack et al. | 438/158 |
| 6,150,668 A | 11/2000 | Bao et al. | |
| 6,403,408 B1 | 6/2002 | Green et al. | |
| 7,344,928 B2 * | 3/2008 | Wong et al. | 438/151 |
| 2004/0012018 A1 | 1/2004 | Tanabe | |
| 2005/0051770 A1 | 3/2005 | Ando et al. | |
| 2006/0202214 A1 | 9/2006 | Yang | |
| 2007/0178616 A1 | 8/2007 | Arai et al. | |
| 2008/0001177 A1 * | 1/2008 | Kim et al. | 257/213 |

FOREIGN PATENT DOCUMENTS

| | | |
|---|---|---|
| EP | 1 385 220 A2 | 1/2004 |
| EP | 1 701 392 A1 | 9/2006 |

(Continued)

OTHER PUBLICATIONS

Extended European Search Report dated Sep. 23, 2011 for corresponding European Application No. 08836892.3.

(Continued)

*Primary Examiner* — Ha Tran T Nguyen
*Assistant Examiner* — Raj R Gupta
(74) *Attorney, Agent, or Firm* — Sughrue Mion, PLLC

(57) ABSTRACT

There is provided a thin film active element including a light-permeable substrate, a light-shielding source/drain electrode formed on the substrate, a light-permeable source/drain electrode formed on a plane surface to which the light-shielding source/drain electrode belongs, and disposed to have a gap interposed between the light-shielding source/drain electrode and the light-permeable source/drain electrode, a channel layer formed in the gap between the light-shielding source/drain electrode and the light-permeable source/drain electrode, and a gate electrode applying an electric field to the channel layer formed in the gap.

5 Claims, 7 Drawing Sheets

FOREIGN PATENT DOCUMENTS

| | | |
|---|---|---|
| JP | 9-186335 A | 7/1997 |
| JP | 2003-84305 A | 3/2003 |
| JP | 2003-508899 A | 3/2003 |
| JP | 2003-229616 A | 8/2003 |
| JP | 2004-055654 A | 2/2004 |
| JP | 2005-223048 A | 8/2005 |
| JP | 2006-253675 A | 9/2006 |
| JP | 2006-294484 A | 10/2006 |

OTHER PUBLICATIONS

Office Action issued Jul. 12, 2011, in Chinese Patent Application No. 200880110811.X, with English translation.

* cited by examiner

LIGHT

MANUFACTURING METHOD OF A THIN FILM ACTIVE ELEMENT

TECHNICAL FIELD

The present invention relates to a thin film active element, an organic light emitting device, a display device, an electronic device, and a method of producing a thin film active element. The present invention particularly relates to a thin film active element, an organic light emitting device, a display device, and an electronic device which are excellent in microfabrication using a simple and easy method, and a method of producing a thin film active element.

BACKGROUND ART

For example, Patent Document 1 describes a technology which suppresses the occurrence of a short circuit across adjacent pixels by wraparound light of backside exposure when forming pixel electrodes by self-alignment of backside exposure using a wiring as a mask. For example, Patent Document 2 discloses a technology which deposits a channel protection film formation film, and forms an organic insulating film on the channel protection film formation film by backside exposure using a gate electrode as a mask. For example, Patent Document 3 discloses a technology in which, using a lower electrode as a photo mask, a lyophilic region having generally the same pattern as that of the lower electrode and a lyophilic region having a pattern which is generally the inversion of the lower electrode pattern are formed on an insulating film, and a conductive ink is applied to the lyophilic region and baked. An upper electrode having a pattern which is generally the inversion of the lower electrode pattern is formed in a self-alignment manner in the region to which the conductive ink is applied.

[Patent Document 1] Japanese Unexamined Patent Publication No. 2003-84305

[Patent Document 2] Japanese Unexamined Patent Publication No. 09-186335

[Patent Document 3] WO 2005/024956

A drive current of a thin film transistor is increased in inverse proportion to a channel length. Consequently, a request to shorten the channel length is strong. When the portion between a source and a drain of the thin film transistor is microfabricated by using, e.g., an expensive stepper aligner, the channel length of the thin film transistor can be shortened. However, the use of the expensive stepper aligner leads to an increase in manufacturing cost.

On the other hand, the use of an inexpensive contact aligner or proximity aligner can suppress the manufacturing cost. However, since the processing accuracy by the inexpensive aligner is at most about 5 to 10 µm, it is not possible to respond to the request to shorten the channel length. A technology for implementing microfabrication of the portion between electrodes such as source and drain electrodes or between wirings with suppressed manufacturing cost is desired.

DISCLOSURE OF THE INVENTION

In order to solve the problem described above, in a first aspect of the present invention, there is provided a method of producing a thin film active element including the steps of forming a light-shielding conductive layer on a light-permeable substrate, forming a light-permeable conductive layer in a region adjacent to the light-shielding conductive layer so as to overlap at least a side of a part in the light-shielding conductive layer, forming a photoresist film covering the light-permeable conductive layer, exposing the photoresist film using the light-shielding conductive layer as a light-shielding mask from a direction of the substrate, forming a mask pattern by developing the photoresist film such that the region of the exposed photoresist film remains, performing etching until the light-shielding conductive layer and the light-permeable conductive layer are spaced apart from each other by overetching the light-permeable conductive layer using the mask pattern as a mask until an etching species comes under the mask, and forming a channel layer functioning as a carrier region of the active element in a gap between the light-permeable conductive layer and light-shielding conductive layer which are spaced apart from each other.

In addition, in a second aspect of the present invention, there is provided a thin film active element including a light-permeable substrate, a light-shielding source/drain electrode formed on the substrate, a light-permeable source/drain electrode formed on a plane surface which is on the substrate and to which the light-shielding source/drain electrode belongs, and disposed to have a gap interposed between the light-shielding source/drain electrode and the light-permeable source/drain electrode, a channel layer formed in the gap between the light-shielding source/drain electrode and the light-permeable source/drain electrode, and a gate electrode applying an electric field to the channel layer formed in the gap.

Figure 1:
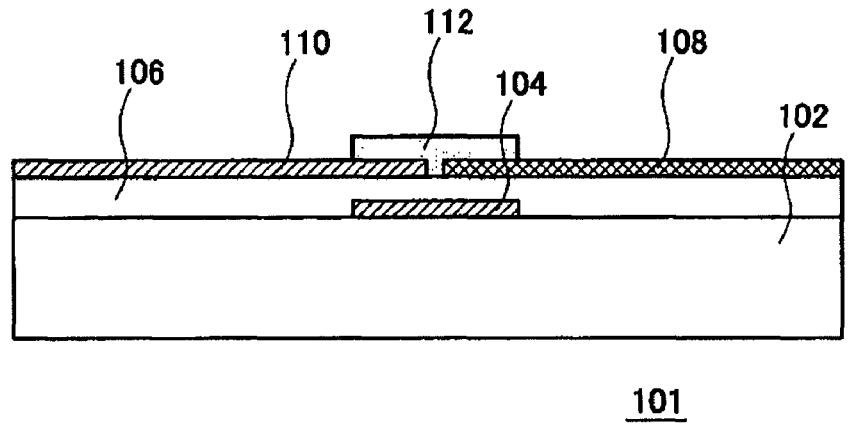
FIG. 1 shows an example of a cross section of a thin film transistor 101 of the present embodiment.

EXPLANATIONS OF LETTERS OR NUMERALS 101 thin film transistor
102 substrate
104 gate electrode
106 gate insulating film
108 source electrode
110 drain electrode
112 channel layer
120 light-permeable conductive layer
122 photoresist film
124 mask pattern
130 region
201 organic light emitting device
202 insulating film
204 organic light emitting layer
206 back electrode
301 electronic device
302 substrate
304 light-shielding wiring
306 light-permeable wiring

BEST MODE FOR CARRYING OUT THE INVENTION

FIG. 1 shows an example of a cross section of a thin film transistor 101 of the present embodiment. The thin film transistor 101 includes a substrate 102, a gate electrode 104, a gate insulating film 106, a source electrode 108, a drain electrode 110, and a channel layer 112. The respective functions as a source and a drain of the source electrode 108 and the drain electrode 110 may be reversed. That is, the source electrode 108 may function not only as the source but also as the drain. The drain electrode 110 may function not only as the drain but also as the source.

As described above, although the respective functions of the source electrode 108 and the drain electrode 110 may be reversed, one of the source and drain electrodes is light-permeable, and the other of the source and drain electrodes is light-shielding. For example, when the source electrode 108 is light-shielding, the drain electrode 110 is light-permeable, while when the source electrode 108 is light-permeable, the drain electrode 110 is light-shielding.

The thin film transistor 101 may be an example of a thin film active element. Examples of the thin film active element include a thin film diode, a thin film solar cell, and a thin film sensor in addition to the thin film transistor 101. The substrate 102 may be light-permeable. An example of the substrate 102 includes a transparent insulating material such as transparent glass or the like.

The gate electrode 104 may be light-permeable. The gate electrode 104 applies an electric field to the channel layer 112. The gate electrode 104 is formed on the substrate 102. An example of the gate electrode 104 includes a light-permeable conductive material such as light-permeable indium tin oxide (ITO), indium zinc oxide (IZO), indium tungsten oxide (IWO), or aluminum-doped zinc oxide (AZO). Additionally, examples of other light-permeable conductive materials include gallium-doped zinc oxide (GZO), fluorine-doped zinc oxide (FZO), antimony-doped tin dioxide (ATO), fluorine-doped tin dioxide (FTO), and magnesium oxide (MgO).

The gate electrode 104 may be one of single layer films of the light-permeable conductive materials described above as the examples, and may also be one of multilayer films thereof. An example of a method for forming the gate electrode 104 includes a method in which a light-permeable conductive layer is deposited over the entire surface of the substrate 102, and the light-permeable conductive layer is then processed by a photolithography method and an etching method.

The gate insulating film 106 may be light-permeable. The gate insulating film 106 is formed on the substrate 102 and the gate electrode 104 so as to cover the gate electrode 104 on the substrate 102. An example of the gate insulating film 106 includes a light-permeable insulating material such as a light-permeable silicon oxide film or the like.

Examples of a method for forming the gate insulating film 106 include a thin film deposition method such as a CVD (Chemical Vapor Deposition) method, a sputtering method, or the like, and a solution application method such as a spin coating method, an inkjet printing method, a printing method, or the like.

The source electrode 108 may be light-shielding, and may be an example of an light-shielding source/drain electrode. The source electrode 108 is formed on the gate insulating film 106. It is to be noted that, since the gate insulating film 106 is formed on the substrate 102, it follows that the source electrode 108 is formed on the substrate.

The source electrode 108 may contain a metal. Examples of the metal include Au, Ag, Ge, Ni, Pd, Pt, Re, Si, Te, W, Al, Cu, Cr, and Mn. The source electrode 108 may be one of single layer films of these metals, or may be one of multilayer films thereof. In addition, the source electrode 108 may be one of single element metal films of the metals described above as the examples, or may be one of alloys containing these metals as main components.

The drain electrode 110 may be light-permeable, and may be an example of a light-permeable source/drain electrode. The drain electrode 110 is formed on the gate insulating film 106. It is to be noted that, since the gate insulating film 106 is formed on the substrate 102, it follows that the drain electrode 110 is formed on the substrate. In addition, the drain electrode 110 is formed on a plane surface which is on the substrate 102 and to which the source electrode 108 belongs, and is disposed to have a gap interposed between the source electrode 108 and the drain electrode 110.

The drain electrode 110 may contain a metal oxide. Examples of the metal oxide include indium tin oxide (ITO), indium zinc oxide (IZO), indium tungsten oxide (IWO), and aluminum-doped zinc oxide (AZO). Additionally, examples of other metal oxides include gallium-doped zinc oxide (GZO), fluorine-doped zinc oxide (FZO), antimony-doped tin dioxide (ATO), fluorine-doped tin dioxide (FTO), and magnesium oxide (MgO). The drain electrode 110 may be one of single layer films of the metal oxides described above as the examples, or may be one of multilayer films thereof.

The channel layer 112 generates a channel region of the transistor between the source electrode 108 and the drain electrode 110. The channel layer 112 is formed at least in the gap between the source electrode 108 and the drain electrode 110. As shown in the drawing, the channel layer 112 may be formed beyond the gap between the source electrode 108 and the drain electrode 110.

It is to be noted that the wordings "light-permeable" and "light-shielding" are used to denote technical meanings shown below in the present embodiment. That is, the concept of the "light-permeable" includes, in addition to a case where all of light incident on a light-permeable member passes through the member, a case where light sufficient enough to cause a photosensitive material to be exposed to light passes through the member. In other words, even in a case where apart of the light incident on the light-permeable member passes through the member, and another part thereof is reflected or absorbed, when the amount of the light having passed through the member is sufficient enough to cause the photosensitive material to be exposed to light, the case is included in the concept of the "light-permeable". On the other hand, the concept of the "light-shielding" includes, in addition to a case where all of light incident on a light-shielding member is shielded, a case where a small amount of light having passed through the light-shielding member does not substantially cause the photosensitive material to be exposed to light. In other words, even in a case where a part of the light incident on the light-shielding member passes through the member, when the light having passed through the member does not substantially cause the photosensitive material to be exposed to light, the case is included in the concept of the "light-shielding".

Figure 2:
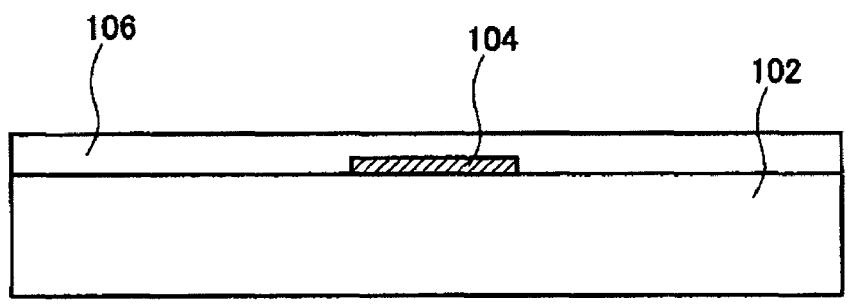
FIG. 2 shows an example of a cross section in a manufacturing process of the thin film transistor 101 of the present embodiment.

FIGS. 2 to 9 show examples of cross sections in the manufacturing process of the thin film transistor 101 of the present embodiment. As shown in FIG. 2, the light-permeable substrate 102 is prepared, and the light-permeable gate electrode 104 is formed on the substrate 102. The gate electrode 104 can be formed by, e.g., the processing which uses the photolithography method and the etching method after the light-permeable conductive layer is deposited on the entire surface of the substrate 102.

Further, the gate insulating film 106 which covers the gate electrode 104 is formed on the substrate 102. The gate insulating film 106 can be formed by using, e.g., the thin film deposition method such as the CVD method, the sputtering method, or the like, and the solution application method such as the spin coating method, the inkjet printing method, the printing method, or the like.

Figure 3:
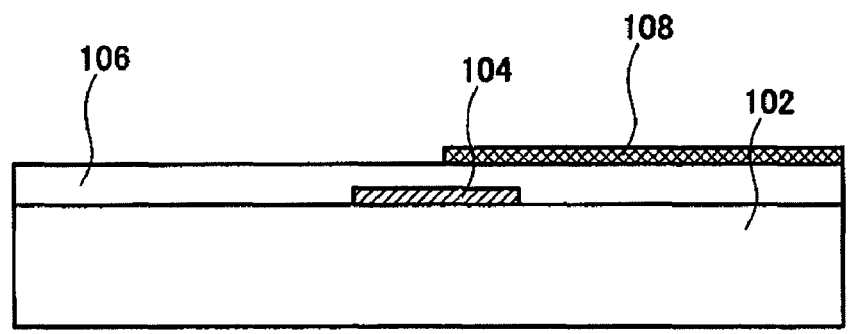
FIG. 3 shows an example of a cross section in the manufacturing process of the thin film transistor 101 of the present embodiment.

As shown in FIG. 3, the source electrode 108 is formed on the substrate 102 formed with the gate electrode 104 and the gate insulating film 106. The source electrode 108 can be formed by forming a light-shielding conductive layer on the entire surface of the substrate 102, and etching the light-shielding conductive film. Examples of the light-shielding conductive film include single element films of Au, Ag, Ge, Ni, Pd, Pt, Re, Si, Te, W, Al, Cu, Cr, and Mn, or alloy films containing these metals as the main components.

The light-shielding conductive film may be the single layer film or the multilayer film. Examples of the deposition method of the light-shielding conductive film include the sputtering method, the CVD method, and the vapor deposition method. An example of a film thickness of the light-shielding conductive film includes a range of 10 nm to 2000 nm. The lower limit of the film thickness of the light-shielding conductive film is defined by a condition such as the film thickness capable of assuring the light-shielding property, while the upper limit of the film thickness is defined by conditions such as the upper limits of the deposition time and the etching time, or the film thickness which does not cause delamination.

Figure 4:
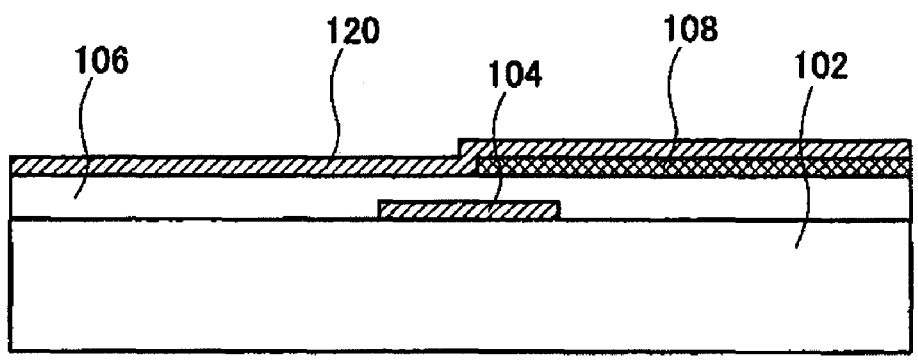
FIG. 4 shows an example of a cross section in the manufacturing process of the thin film transistor 101 of the present embodiment.

As shown in FIG. 4, in a region adjacent to the source electrode 108 as the light-shielding conductive layer, a light-permeable conductive layer 120 is formed so as to overlap at least a side of a part in the source electrode 108. Examples of the light-permeable conductive layer 120 include indium tin oxide (ITO), indium zinc oxide (IZO), indium tungsten oxide (IWO), and aluminum-doped zinc oxide (AZO). Additionally, examples thereof include gallium-doped zinc oxide (GZO), fluorine-doped zinc oxide (FZO), antimony-doped tin dioxide (ATO), fluorine-doped tin dioxide (FTO), and magnesium oxide (MgO).

Examples of a method for forming the light-permeable conductive layer 120 include the sputtering method and the CVD method. An example of a film thickness of the light-permeable conductive layer 120 includes a range of 50 nm to 2000 nm. The lower limit of the film thickness of the light-permeable conductive layer 120 is defined by the condition such as the film thickness capable of assuring a sheet resistance value, while the upper limit of the film thickness is defined by conditions such as the film thickness capable of assuring light transmittance, the upper limits of the deposition time and the etching time, or the film thickness which does not cause delamination.

Figure 5:
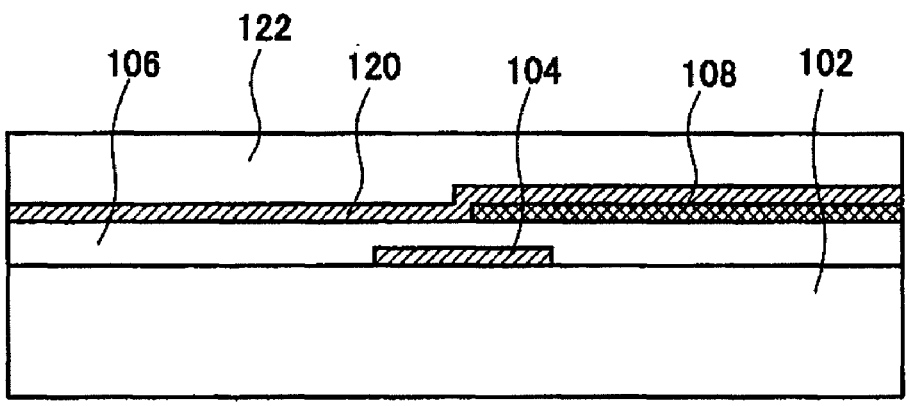
FIG. 5 shows an example of a cross section in the manufacturing process of the thin film transistor 101 of the present embodiment.

As shown in FIG. 5, a photoresist film 122 which covers at least the light-permeable conductive layer 120 is formed. As the photoresist film 122, a negative-type sensitive resin is preferable. When the photoresist film 122 is formed by spin application or the like, pre-bake is executed after the application.

Figure 6:
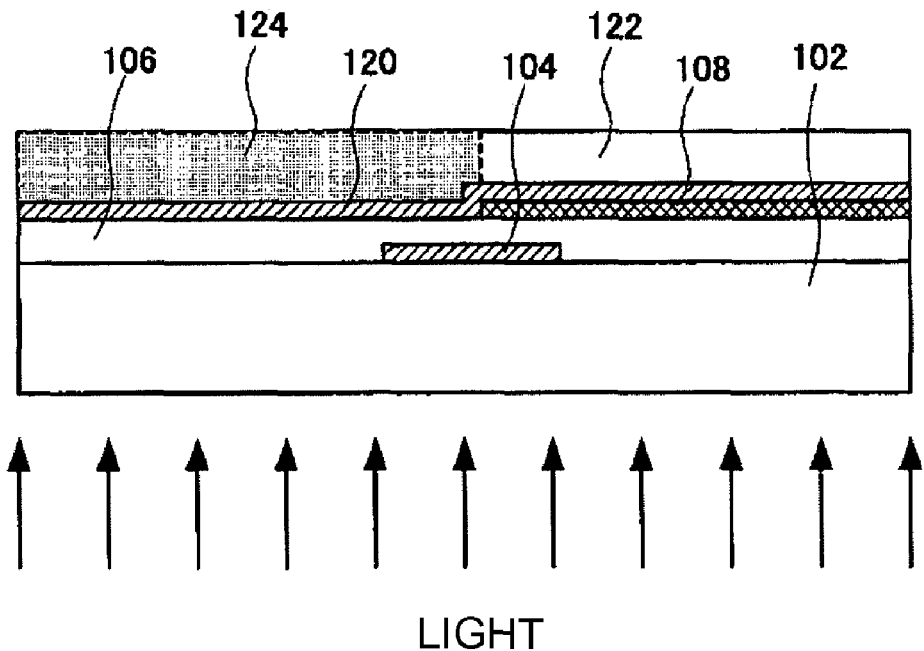
FIG. 6 shows an example of a cross section in the manufacturing process of the thin film transistor 101 of the present embodiment.

As shown in FIG. 6, the photoresist film 122 is exposed from a direction of the substrate 102 by using the source electrode 108 which is the light-shielding conductive layer as a light-shielding mask. As the result of the exposure, an exposed region is formed in the photoresist film 122 in the region in which the source electrode 108 is not formed. The exposed region serves as a mask pattern 124.

Figure 7:
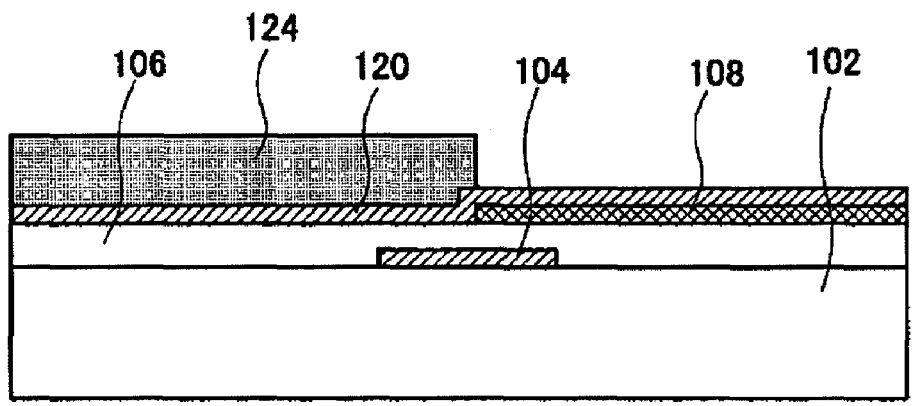
FIG. 7 shows an example of a cross section in the manufacturing process of the thin film transistor 101 of the present embodiment.

As shown in FIG. 7, the photoresist film 122 is developed such that the exposed region as the region of the exposed photoresist film 122 remains. As the result of the development and the post-bake performed thereafter, the mask pattern 124 is formed. It is to be noted that, since the exposure using the source electrode 108 as the light-shielding mask from the direction of the substrate 012, i.e., backside exposure is used in the formation of the mask pattern 124, the mask pattern 124 is formed by self-alignment with respect to the source electrode 108.

Figure 8:
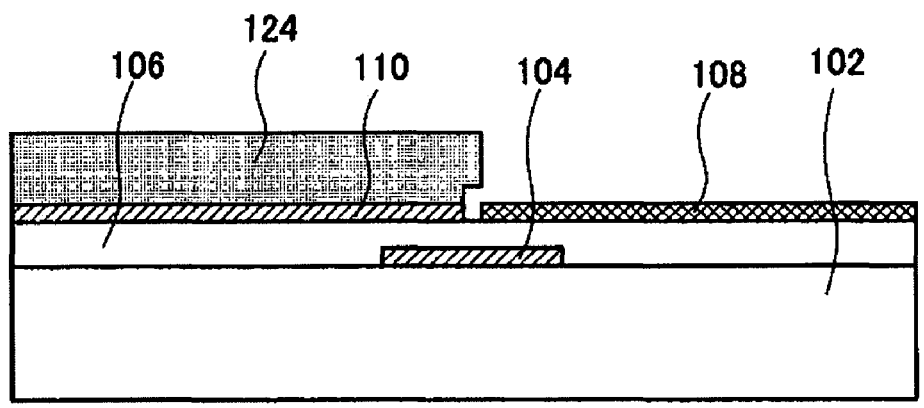
FIG. 8 shows an example of a cross section in the manufacturing process of the thin film transistor 101 of the present embodiment.

As shown in FIG. 8, the light-permeable conductive layer 120 is overetched using the mask pattern 124 as a mask until an etching species comes under the mask pattern 124. In the overetching, etching is performed until the source electrode 108 as the light-shielding conductive layer and the light-permeable conductive layer 120 are spaced apart from each other. It is to be noted that the drain electrode 110 is formed by the etching performed until the source electrode 108 and the light-permeable conductive layer 120 are spaced apart from each other.

Figure 9:
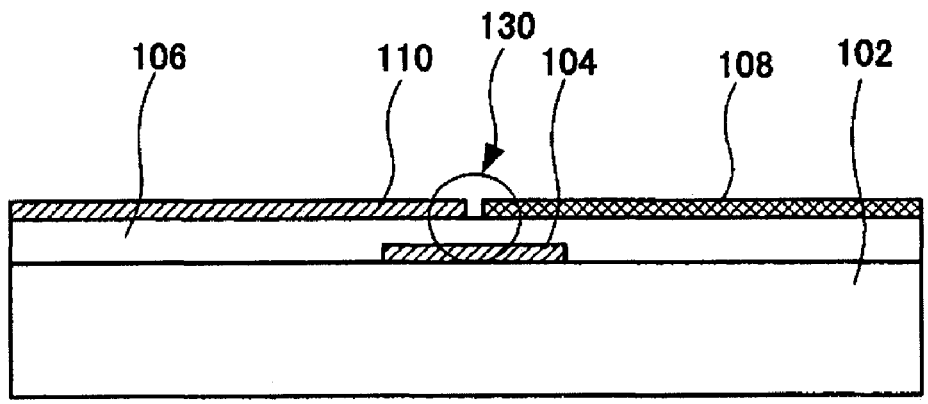
FIG. 9 shows an example of a cross section in the manufacturing process of the thin film transistor 101 of the present embodiment.

As shown in FIG. 9, the mask pattern 124 is peeled off to expose the drain electrode 110, and the channel layer 112 is formed so as to fill in the gap between the source electrode 108 and the drain electrode 110, whereby the thin film transistor 101 shown in FIG. 1 can be manufactured. When the channel layer 112 is an organic semiconductor, the channel layer 112 can be formed by, e.g., the application. The formation of the channel layer 112 using the application may be similar to the case of an electron injection layer, an electron transport layer, a hole injection layer, or a hole transport layer which will be described later.

In the thin film transistor 101 of the present embodiment, the drain electrode 110 as the light-permeable conductive film is formed by the etching using, as the mask, the mask pattern 124 formed by the self-alignment with respect to the source electrode 108 as the light-shielding conductive film. In the etching, the light-permeable conductive layer 120 serving as the drain electrode 110 is overetched so as to be positioned under the mask pattern 124. Consequently, it is possible to microfabricate the gap between the source electrode 108 and the drain electrode 110, and minutely form the channel length of the thin film transistor 101. The microfabrication does not require an expensive stepper aligner, and can be performed at low cost.

It is to be noted that, in the above-described embodiment, the description has been given to an example of what is called a bottom gate in which the light-permeable gate electrode 104 and the light-permeable gate insulating film 106 are formed on the substrate 102 before the source electrode 108 as the light-shielding conductive layer is formed. However, the method for forming the source electrode 108 and the drain electrode 110 in the above-described embodiment can be applied to the case with what is called a top gate in which the gate insulating film and the gate electrode are formed after the channel layer 112 is formed.

In addition, in the etching method in which the etching is performed until the source electrode 108 as the light-shielding conductive layer and the light-permeable conductive layer 120 are spaced apart from each other, it is possible to use a wet etching method. It is possible to overetch the light-permeable conductive layer 120 by using the wet etching method. Alternatively, in the etching method in which the etching is performed until the source electrode 108 as the light-shielding conductive layer and the light-permeable conductive layer 120 are spaced apart from each other, it is possible to overetch the light-permeable conductive layer 120 by using a plasma etching method which generates a halogen-based radical or ion, or an oxygen-based radical or ion as the etching species.

Figure 10:
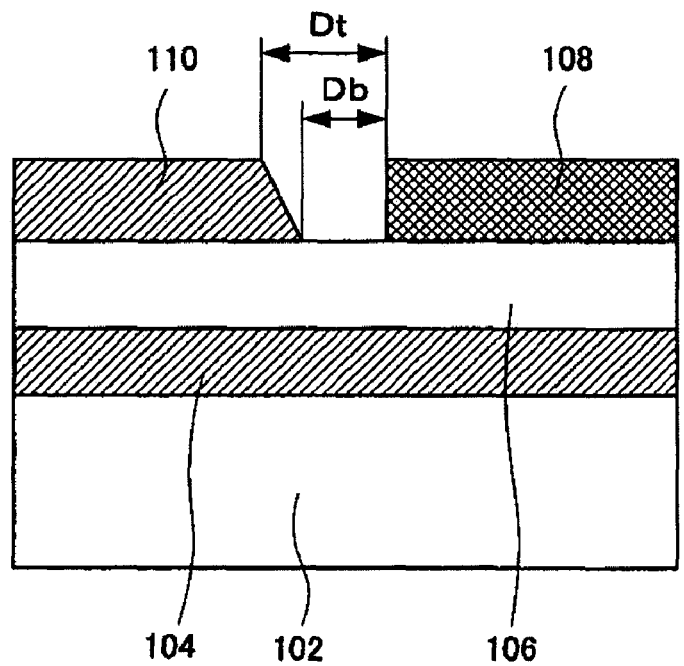
FIG. 10 shows an example of an enlarged cross section of a region 130 of FIG. 9.

FIG. 10 shows an example of an enlarged cross section of a region 130 of FIG. 9. The drain electrode 110 is formed so as to oppose the source electrode 108 with the gap interposed between the source electrode 108 and the drain electrode 110. A cross-sectional configuration obtained when the drain electrode 110 is cut by a plane which is perpendicular to the surface of the light-permeable substrate 102 and crosses the gap can be formed into a forward tapered configuration in which the portion of the drain electrode 110 on an interface side with the light-permeable substrate 102 juts out farther toward the gap than the portion thereof on the other side. That is, a width Db of the gap on the interface side with the light-permeable substrate 102 is smaller than a width Dt of the gap on the other side. By having such a cross-sectional configuration, it is possible to reliably form the channel layer 112 in the gap.

Such a cross-sectional configuration is obtainable by executing the etching processing with respect to the light-permeable conductive layer 120 while causing the mask pattern 124 to gradually recede. For example, it is possible to repeatedly perform the process in which the light-permeable conductive layer 120 is etched, the mask pattern 124 is caused to recede by, e.g., the etching using an oxygen-based material gas, and the light-permeable conductive layer 120 is further etched.

Figure 11:
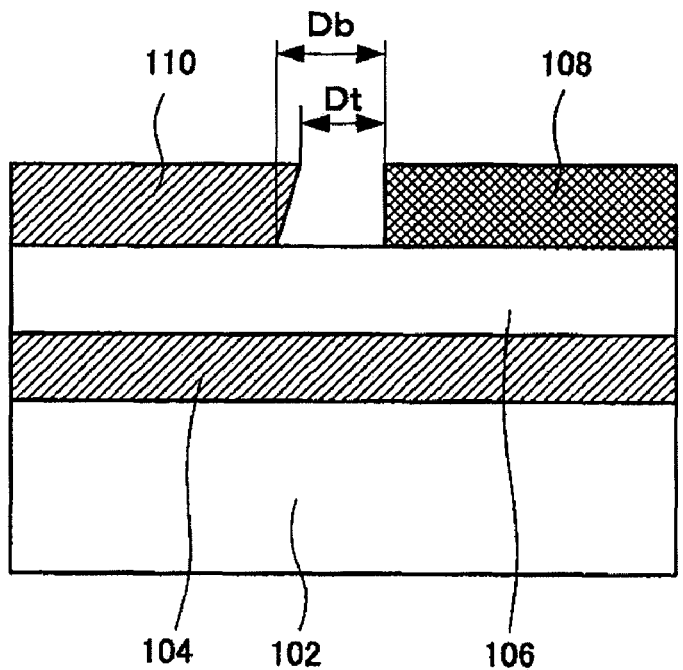
FIG. 11 shows another example of the enlarged cross section of the region 130 of FIG. 9.

FIG. 11 shows another example of the enlarged cross section of the region 130 of FIG. 9. The drain electrode 110 is formed so as to oppose the source electrode 108 with the gap interposed between the source electrode 108 and the drain electrode 110. The cross-sectional configuration obtained when the drain electrode 110 is cut by the plane which is perpendicular to the surface of the light-permeable substrate 102 and crosses the gap can be formed into a reverse tapered configuration in which the portion of the drain electrode 110 on the side opposite to the interface side with the light-permeable substrate 102 juts out farther toward the gap than the portion thereof on the other side.

That is, the width Db of the gap on the interface side with the light-permeable substrate 102 is larger than the width Dt of the gap on the other side. By having such a cross-sectional configuration, for example, it is possible to bring an electric flux line (electric flux) by an electric field distribution from the gate electrode 104 close to a direction perpendicular to the cross section. As the result, it is possible to suppress local concentration of the electric field in a channel region to stabilize characteristics of the transistor. Such a cross-sectional configuration can be implemented by, e.g., adjusting an etchant composition and a processing temperature in the wet etching method.

Figure 12:
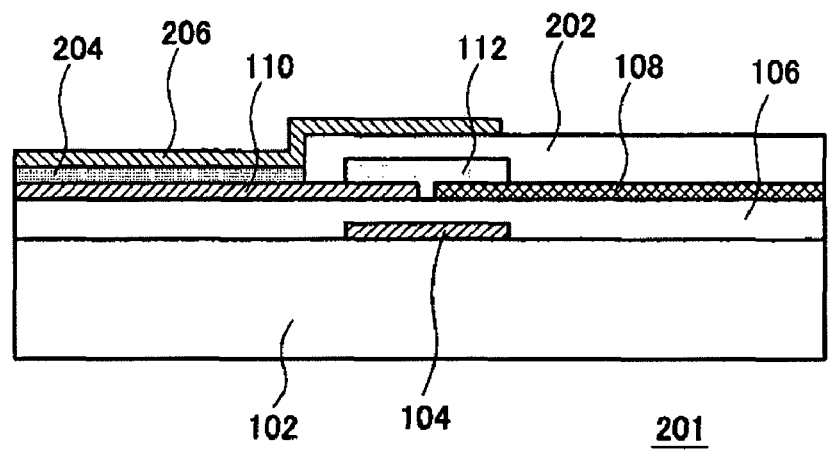
FIG. 12 shows an example of across section of an organic light emitting device 201 of the present embodiment.

FIG. 12 shows an example of a cross section of an organic light emitting device 201 of the present embodiment. On the light-permeable substrate 102, the thin film transistor 101 which may be an example of the thin film active element is formed. Similarly to the foregoing, the thin film transistor 101 includes the substrate 102, the light-permeable gate electrode 104, the light-permeable gate insulating film 106, the light-shielding source electrode 108, the light-permeable drain electrode 110, and the channel layer 112.

The organic light emitting device 201 further includes an insulating film 202 which covers the channel layer 112 and an organic light emitting element. The organic light emitting element has a transparent electrode formed of the same material as the drain electrode 110, an organic light emitting layer 204, and a back electrode 206 which covers the organic light emitting layer 204. In the organic light emitting device 201, the organic light emitting element is driven by the thin film transistor 101.

It is to be noted that the transparent electrode held by the organic light emitting element and the drain electrode 110 as an example of the light-permeable source/drain electrode are formed by processing the conductive layer deposited by the same film deposition process. Accordingly, it is possible to reduce the number of manufacturing steps and suppress the manufacturing cost. In addition, in FIG. 12, as the element driven by the thin film transistor 101, the organic light emitting element is shown as an example. However, a display element such as a liquid crystal display element or the like may be driven.

Figure 13:
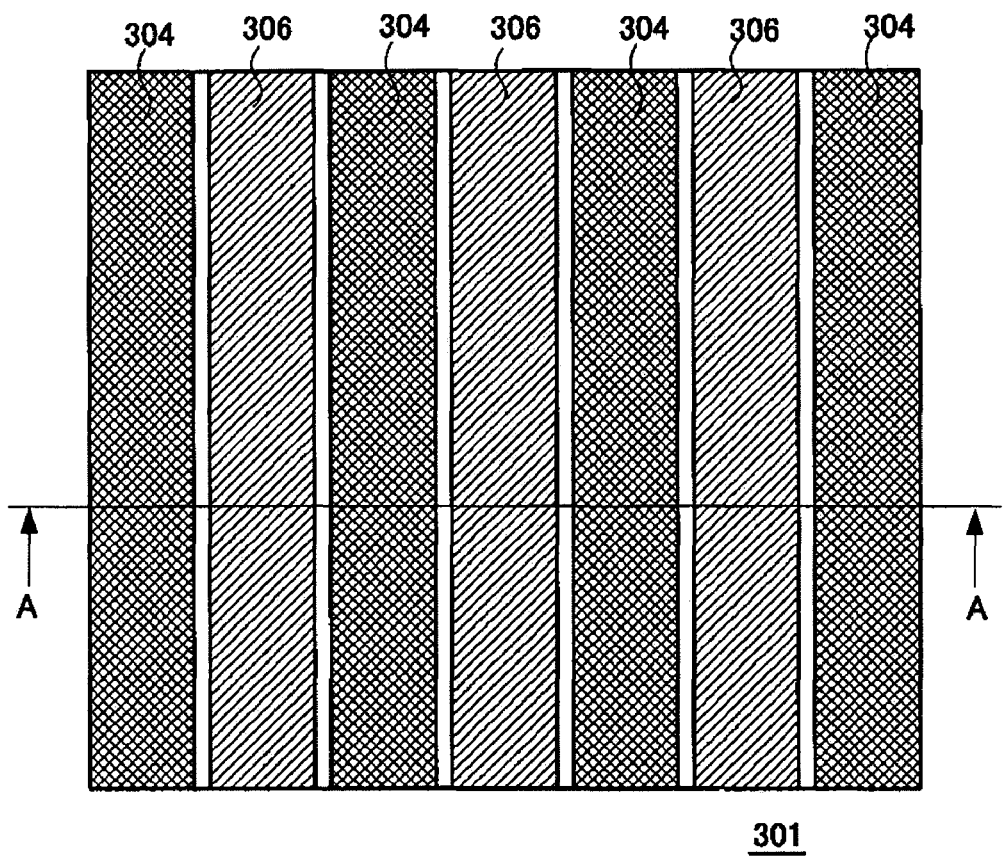
FIG. 13 shows an upper surface of an electronic device 301 of the present embodiment.
Figure 14:
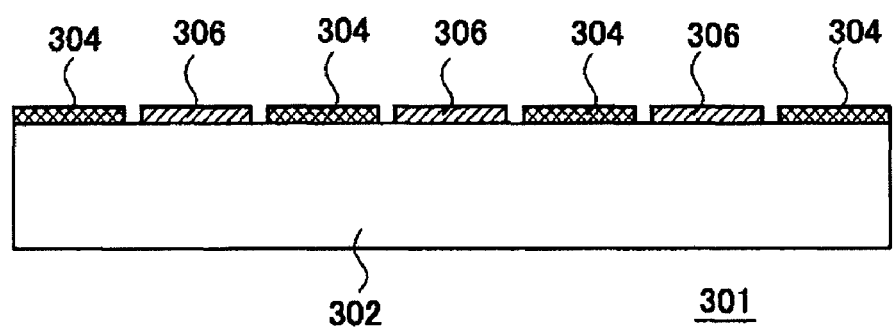
FIG. 14 shows a cross section taken along the line A-A in FIG. 13.

FIG. 13 shows an upper surface of an electronic device 301 of the present embodiment. FIG. 14 shows a cross section taken along the line A-A in FIG. 13. The electronic device 301 includes a light-permeable substrate 302, light-shielding wirings 304 formed on the substrate 302, and light-permeable wirings 306 which are formed on a plane surface which is on the substrate 302 and to which the light-shielding wirings 304 belong, and are disposed with the gaps interposed between the light-shielding wirings 304 and the light-permeable wirings 306.

Further, each of the light-permeable wirings 306 is formed in the same manner as the drain electrode 110 of the thin film transistor 101 described above. In accordance with the electronic device 301 of this type, the spacing between the wirings can be microfabricated. The microfabrication does not require an expensive stepper aligner or the like, and the wirings can be microfabricated at low cost.

It is to be noted that a carrier injection layer can be further provided either between the source electrode 108 and the channel layer 112, or between the drain electrode 110 and the channel layer 112. In addition, there can be provided a light-shielding electrode side carrier injection layer formed between the source electrode 108 and the channel layer 112, and a light-permeable electrode side carrier injection layer formed between the drain electrode 110 and the channel layer 112, and the light-permeable electrode side carrier injection layer and the light-shielding electrode side carrier injection layer can have different carrier injection efficiencies. In this case, it is possible to select the material for the carrier injection layer in order to provide the uniform carrier injection efficiency.

Further, the carrier injection layer can be provided either one or both of between the source electrode 108 and the channel layer 112, and between the drain electrode 110 and the channel layer 112. With the carrier injection layer, it becomes possible to equalize the carrier injection efficiency between the source electrode 108 and the channel layer 112, and the carrier injection efficiency between the drain electrode 110 and the channel layer 112. The channel layer 112 can be formed of, e.g., an organic substance, especially an organic semiconductor, and the carrier injection layer can be formed of, e.g., the organic substance, especially the organic conductive material.

An example of a structure when the light emitting element in the present embodiment is provided as an organic electroluminescence element will be shown. Hereinbelow, the organic electroluminescence element is occasionally referred to as an organic EL element.

In addition to a positive electrode, a light emitting layer, and a negative electrode, the organic EL element of the present embodiment can further has other layers between the positive electrode and the light emitting layer and/or between the light emitting layer and the negative electrode. The layer that can be provided between the negative electrode and the light emitting layer includes the electron injection layer, the electron transport layer, and a hole blocking layer. When both of the electron injection layer and the electron transport layer are provided, a layer closer to the negative electrode becomes the electron injection layer, while a layer closer to the light emitting layer becomes the electron transport layer.

The electron injection layer has a function of improving electron injection efficiency from the negative electrode. The electron transport layer has a function of improving the electron injection form the negative electrode, the electron injection layer, or the electron transport layer closer to the negative electrode.

When the electron injection layer or the electron transport layer has a function of stopping the transport of the hole, there layers occasionally serve as the hole blocking layers. With regard to the possession of the function of stopping the transport of the hole, it is possible to ascertain the effect of stopping the transport of the hole by, e.g., manufacturing an element that allows the passage of a hole current and does not allow the passage of an electron current, and examining a decrease in the current value.

The layer provided between the positive electrode and the light emitting layer includes the hole injection layer, a hole transport layer, and an electron blocking layer. When both of the hole injection layer and the hole transport layer are provided, a layer closer to the positive electrode becomes the hole injection layer, while a layer closer to the light emitting layer becomes the hole transport layer.

The hole injection layer has the function of improving hole injection efficiency from the positive electrode. The hole transport layer has the function of improving the hole injection from the positive electrode, the hole injection layer, or the hole transport layer closer to the positive electrode.

When the hole injection layer or the hole transport layer has the function of stopping the transport of the electron, these layers occasionally serve as the electron blocking layers. With regard to the possession of the function of stopping the transport of the electron, it is possible to ascertain the effect of stopping the transport of the electron by, e.g., manufacturing an element that allows the passage of the electron current and does not allow the passage of the hole current, and examining a decrease in the current value.

In the organic EL element of the present embodiment, one light emitting layer is provided. However, the number of light emitting layers is not limited thereto, and two or more light emitting layers can be provided. It is to be noted that the electron injection layer and the hole injection layer are occasionally generically referred to as a charge injection layer, while the electron transport layer and the hole transport layer are occasionally generically referred to as a charge transport layer. More specifically, the organic EL element of the present embodiment can have any of layer structures shown below:

a) positive electrode/hole transport layer/light emitting layer/negative electrode,
b) positive electrode/light emitting layer/electron transport layer/negative electrode,
c) positive electrode/hole transport layer/light emitting layer/electron transport layer/negative electrode,
d) positive electrode/charge injection layer/light emitting layer/negative electrode,
e) positive electrode/light emitting layer/charge injection layer/negative electrode,
f) positive electrode/charge injection layer/light emitting layer/charge injection layer/negative electrode,
g) positive electrode/charge injection layer/hole transport layer/light emitting layer/negative electrode,
h) positive electrode/hole transport layer/light emitting layer/charge injection layer/negative electrode,
i) positive electrode/charge injection layer/hole transport layer/light emitting layer/charge injection layer/negative electrode,
j) positive electrode/charge injection layer/light emitting layer/charge transport layer/negative electrode,
k) positive electrode/light emitting layer/electron transport layer/charge injection layer/negative electrode,
l) positive electrode/charge injection layer/light emitting layer/electron transport layer/charge injection layer/negative electrode,
m) positive electrode/charge injection layer/hole transport layer/light emitting layer/charge transport layer/negative electrode,
n) positive electrode/hole transport layer/light emitting layer/electron transport layer/charge injection layer/negative electrode,
o) positive electrode/charge injection layer/hole transport layer/light emitting layer/electron transport layer/charge injection layer/negative electrode ("/" indicates herein that the individual layers are laminated in adjacent to each other. The same shall applies to the "/" shown below.).

The organic EL element of the present embodiment may have two or more light emitting layers. A specific example of the organic EL element having two light emitting layers that can be listed includes the one having the following layer structure:

p) positive electrode/charge injection layer/hole transport layer/light emitting layer/electron transport layer/charge injection layer/electrode/charge injection layer/hole transport layer/light emitting layer/electron transport layer/charge injection layer/negative electrode.

A specific example of the organic EL element having three or more light emitting layers that can be listed includes, when the layer structure of electrode/charge injection layer/hole transport layer/light emitting layer/electron transport layer/charge injection layer is given as one repetitive unit, the one having the layer structure including two or more layers of the repetitive units, as shown below:

q) positive electrode/charge injection layer/hole transport layer/light emitting layer/electron transport layer/charge injection layer/repetitive unit/repetitive unit . . . /negative electrode.

In the above-described layer structures p and q, the layers other than the positive electrode, the negative electrode, and the light emitting layer can be deleted. Herein, by applying the electric field, the electrode generates the hole and the electron. Examples that can be listed include vanadium oxide, indium tin oxide, and molybdenum oxide.

The organic EL element of the present embodiment can further have the substrate, and the individual layers described above can be provided on the substrate. The organic EL element of the present embodiment can also have a member for sealing on the opposite side of the substrate with the individual layers interposed therebetween. Although the organic EL element with the substrate and the individual layers described above has the substrate on the positive-electrode side, the side is not limited to the positive-electrode side in the present embodiment, and the organic EL element may have the substrate either on the positive-electrode side or on the negative-electrode side.

In the organic EL element of the present embodiment, for the purpose of releasing the light from the light emitting layer, all of the layers on either one side of the light emitting layer are formed to be transparent. Specifically, for example, in the case of the organic EL element having the structure of substrate/positive electrode/charge injection layer/hole transport layer/light emitting layer/electron transport layer/charge injection layer/negative electrode/sealing member, the organic EL element can be provided as what is called a bottom emission type element by forming all of the substrate, the positive electrode, the charge injection layer, and the hole transport layer to be transparent. Alternatively, the organic EL element can be provided as what is called a top emission type element by forming all of the electron transport layer, the charge injection layer, the negative electrode, and the sealing member to be transparent.

Further, in the case of the organic EL element having the structure of substrate/negative electrode/charge injection layer/electron transport layer/light emitting layer/hole transport layer/charge injection layer/positive electrode/sealing member, the organic EL element can be provided as what is called the bottom emission type element by forming all of the substrate, the negative electrode, the charge injection layer, and the electron transport layer to be transparent.

Alternatively, by forming all of the hole transport layer, the charge injection layer, the positive electrode, and the sealing member to be transparent, what is called the top emission type element can be provided. With regard to the word "transparent" used herein, a visible light transmittance from the light emitting layer to the layer that releases the light is preferably not less than 40%. In the case of the element of which the light emission in an ultraviolet region or infrared region is required, the element having the visible light transmittance of not less than 40% in the region is preferable.

In the organic EL element of the present embodiment, For the purpose of increasing adhesion to the electrode or improving the injection of the charge from the electrode, the above-described charge injection layer or an insulating layer having a film thickness of not more than 2 nm may be provided adjacent to the electrode and, for the purpose of increasing the adhesion to the interface or preventing mixture, a thin buffer layer may be inserted into the interface with the charge transport layer or the light emitting layer. The order of lamination of the layers, the number of layers, and the thickness of each layer can be appropriately determined in consideration of light emission efficiency or element life.

Next, a more specific description will be given of the material for each layer constituting the organic EL element of the present embodiment and a method for forming the layer. The substrate constituting the organic EL element of the present embodiment may be any material which is not deformed when the electrode is formed and organic layers are formed, and, for example, glass, plastic, a polymeric film, a silicon substrate, or a substrate obtained by laminating these is used. As the substrate described above, a commercially-supplied substrate is available, or the substrate can be manufactured by a known method.

As the positive electrode of the organic EL element of the present embodiment, the use of a transparent or translucent electrode is preferable because it can constitute the element which emits light through the positive electrode. As the material for such a transparent or translucent electrode, a metal oxide, a metal sulfide, or a metal thin film having high electrical conductivity can be used, the material having high transmittance can be preferably used, and the material is appropriately selected and used in accordance with the organic layer to be used. Specifically, there are used indium oxide, zinc oxide, tin oxide, indium tin oxide (ITO) as a composite of the oxides mentioned above, a film (NESA or the like) formed by using a conductive glass containing indium zinc oxide or the like, gold, platinum, silver, and copper; and ITO, indium zinc oxide, and tin oxide are preferable. Examples of a manufacturing method that can be listed include a vacuum vapor deposition method, the sputtering method, an ion plating method, and a plating method. Further, as the positive electrode, an organic transparent conductive film such as polyaniline or its derivative, or polythiophene or its derivative may be used.

For the positive electrode, a material that reflects light may be used and, as the material, a metal, a metal oxide, or a metal sulfide having a work function of not less than 3.0 eV is preferable. A film thickness of the positive electrode can be appropriately selected in consideration of the light transmittance and the electrical conductivity and, for example, the film thickness is in the range of 10 nm to 10 µm, preferably 20 nm to 1 µm, and more preferably 50 nm to 500 nm.

The hole injection layer can be provided between the positive electrode and the hole transport layer, or between the positive electrode and the light emitting layer. In the organic EL element of the present embodiment, examples of a material for forming the hole injection layer that can be listed include phenylamine series; starburst type amine series; phthalocyanine series; oxides such as vanadium oxide, molybdenum oxide, ruthenium oxide, and aluminum oxide; amorphous carbon; polyaniline; and a polythiophene derivative.

Examples of a material for composing the hole transport layer include polyvinylcarbazole or its derivative; polysilane or its derivative; a polysiloxane derivative having aromatic amine at a side or main chain; a pyrazoline derivative; an arylamine derivative; a stilbene derivative; and a triphenyldiamine derivative. Additionally, examples thereof include polyaniline or its derivative; polythiophene or its derivative; polyarylamine or its derivative; polypyrrole or its derivative; poly (p-phenylenevinylene) or its derivative; and poly (2,5-thienylenevinylene) or its derivative.

Among them, as the hole transport material used for the hole transport layer, polyvinylcarbazole or its derivative, polysilane or its derivative, the polysiloxane derivative having aromatic amine at a side or main chain, polyaniline or its derivative, and polythiophene or its derivative are preferable. Additionally, polymeric hole transport materials such as polyarylamine or its derivative, poly (p-phenylenevinylene) or its derivative, and poly (2,5-thienylenevinylene) or its derivative are preferable. Polyvinylcarbazole or its derivative, polysilane or its derivative, and the polysiloxane derivative having aromatic amine at a side or main chain are more preferable. In the case of a low-molecular hole transport material, the material is preferably used after being dispersed in a polymeric binder.

Although the film formation method of the hole transport layer is not limited, in the case of the low-molecular hole transport material, an example of the film formation method includes a method using the film formation from a solution mixed with the polymeric binder. On the other hand, in the case of the polymeric hole transport material, an example thereof includes a method using the film formation from a solution. A solvent used for the film formation from the solution is not particularly limited as long as it dissolves the hole transport material. Examples of the solvent include chlorine-based solvents such as chloroform, methylene chloride, and dichloroethane; ether-based solvents such as tetrahydrofuran and the like; aromatic hydrocarbon-based solvents such as toluene and xylene; ketone-based solvents such as acetone and methylethylketone; and ester-based solvents such as ethyl acetate, butyl acetate, and ethyl cellosolve acetate.

As the method for the film formation from the solution, there can be used a spin coating method, a casting method, a micro gravure coating method, a gravure coating method, a bar coating method, a roll coating method, a wire bar coating method, and a dip coating method each from the solution. Additionally, there can be used application methods such as a spray coating method, a screen printing method, a flexographic printing method, an offset printing method, and an inkjet printing method.

As the polymeric binder to be mixed, a binder witch does not extremely inhibit the electron transport is preferable, and a binder whose absorption with respect to visible light is not very effective is preferably used. Examples of the polymeric binder include polycarbonate, polyacrylate, polymethylacrylate, polymethylmethacrylate, polystyrene, polyvinyl chloride, and polysiloxane.

With regard to a film thickness of the hole transport layer, the optimum value thereof is different in accordance with the material to be used, and the film thickness may be selected such that the drive voltage and the light emission efficiency have appropriate values. The minimum film thickness can be determined from conditions of the film thickness which prevents at least the occurrence of a pinhole. From the viewpoint that an excessively thick film thickness disadvantageously increases the drive voltage of the element, the maximum film thickness can be determined. Accordingly, the film thickness of the hole transport layer is, e.g., in the range of 1 nm to 1 µm, preferably 2 nm to 500 nm, and more preferably 5 nm to 200 nm.

The light emitting layer is preferably an organic light emitting layer in the present embodiment, and is formed mainly of an organic substance (low-molecular compound and polymeric compound) which emits fluorescence or phosphorescence, and a dopant which aids the organic substance. Examples of a material for forming the light emitting layer that can be used in the present embodiment include the followings.

Examples of a pigment-based material that can be listed include a cyclopendamine derivative, a tetraphenylbutadiene derivative compound, a triphenylamine derivative, an oxadiazole derivative, a pyrazoloquinoline derivative, and a distyrylbenzene derivative. Additionally, examples thereof that can be listed include a distyrylarylene derivative, a pyrrole derivative, a thiophene ring compound, a pyridine ring compound, a perinone derivative, a perylene derivative, an oligothiophene derivative, a triphmanylamine derivative, an oxadiazole dimer, and a pyrazoline dimer.

Examples of a metal complex-based material that can be listed include metal complexes having, as central metals, Al, Zn, and Be, or rare earth metals such as Tb, Eu, and Dy, and having, as ligands, oxadiazole, thiadiazole, phenylpyridine, phenylbenzimidazole, and quinoline structures. Examples of the metal complexes that can be listed include a metal complex having light emission from a triplet excitation state such as an iridium complex or a platinum complex, an alumiquinolinol complex, a benzoquinolinol beryllium complex, a benzoxazolyl zinc complex, a benzothiazol zinc complex, an azomethyl zinc complex, a porphyrin zinc complex, and a europium complex.

Examples of a polymeric material that can be listed include a polyparaphenylenevinylene derivative, the polythiophene derivative, a polyparaphenylene derivative, and the polysilane derivative. Additionally, examples thereof that can be listed further include a polyacetylene derivative, a polyfluorene derivative, a polyvinylcarbazole derivative, and materials obtained by polymerizing the above-described pigment-based materials or metal complex-based light emitting materials.

Among the above-described light emitting materials, examples of the material emitting blue light that can be listed include the distyrylarylene derivative, the oxadiazole derivative, polymers of these derivatives, the polyvinylcarbazole derivative, the polyparaphenylene derivative, and the polyfluorene derivative. Among them, the polyvinylcarbazole derivative, the polyparaphenylene derivative, and the polyfluorene derivative as the polymeric materials are preferable.

In addition, examples of the material emitting green light that can be listed include a quinacridone derivative, a coumarin derivative, polymers of these derivatives, the polyparaphenylenevinylene derivative, and the polyfluorene derivative. Among them, the polyparaphenylenevinylene derivative and the polyfluorene derivative as the polymeric materials are preferable.

Further, examples of the material emitting red light that can be listed include the coumarin derivative, the thiophene ring compound, polymers of these derivatives, the polyparaphenylenevinylene derivative, the polythiophene derivative, and the polyfluorene derivative. Among them, the polyparaphenylenevinylene derivative, the polythiophene derivative, and the polyfluorene derivative as the polymeric materials are preferable.

For the purpose of increasing the light emission efficiency or changing the light emission wavelength, the dopant may be added into the light emitting layer. Examples of such a dopant that can be listed include the perylene derivative, the coumarin derivative, a rubrene derivative, the quinacridone derivative, a squarylium derivative, a porphyrin derivative, a styryl-based pigment, a tetracene derivative, a pyrazolone derivative, decacyclene, and phenoxazone. It is to be noted that a thickness of the light emitting layer of this type can be set to the range of 2 to 200 nm.

As the film formation method of the light emitting layer containing the organic substance, there can be used a method in which a solution containing the light emitting material is applied onto a base body or to an upper portion of the base body, the vacuum vapor deposition method, and a transfer method. An specific example of the solvent used for the film formation from the solution that can be listed includes a solvent similar to the solvent which dissolves the hole transport material used for the film formation of the hole transport layer from the solution mentioned above.

As the method in which the solution containing the light emitting material is applied onto the base body or to the upper portion of the base body, the coating method can be used.

Examples of the coating method include the spin coating method, the casting method, the micro gravure coating method, the gravure coating method, the bar coating method, the roll coating method, the wire bar coating method, the dip coating method, a slit coating method, a capillary coating method, the spay coating method, and a nozzle coating method. Additionally, there can be used the application methods such as the gravure printing method, the screen printing method, the flexographic printing method, the offset printing method, a reverse printing method, and the inkjet printing method.

In the point that the pattern formation or separate application of many colors is easily performed, the gravure printing method, the screen printing method, the flexographic printing method, the offset printing method, the reverse printing method, and the inkjet printing method are preferable. In addition, in the case of a sublimation low-molecular compound, the vacuum vapor deposition method can be used. Further, it is also possible to use a method which forms the light emitting layer in a predetermined region using laser transferor thermal transfer.

As the electron transport layer, a known electron transport layer can be used, and examples thereof include the oxadiazole derivative, anthraquinodimethane or its derivative, benzoquinone or its derivative, naphthoquinone or its derivative, anthraquinone or its derivative, tetracyanoanthraquinodimethane or its derivative, and a fluorenone derivative. Additionally, examples thereof include diphenyldicyanoethylene or its derivative, a diphenoquinone derivative, 8-hydroxyquinoline or a metal complex of its derivative, polyquinoline or its derivative, polyquinoxaline or its derivative, and polyfluorene or its derivative.

Among them, the oxadiazole derivative, benzoquinone or its derivative, anthraquinone or its derivative, 8-hydroxyquinoline or the metal complex of its derivative, polyquinoline or its derivative, polyquinoxaline or its derivative, and polyfluorene or its derivative are preferable. 2-(4-biphenylyl)-5-(4-t-butylphenyl)-1,3,4-oxadiazole, benzoquinone, anthraquinone, tris(8-quinolinol)aluminum, and polyquinoline are more preferable.

Although the film formation method of the electron transport layer is not particularly limited, for the low-molecular electron transport material, the vacuum vapor deposition method from powders or the method of the film formation from the solution or the dissolved state are shown as examples, while for the polymeric electron transport material, the method of the film formation from the solution or the dissolved state is shown as an example. During the film formation from the solution or the dissolved state, the polymeric binder may be used in combination. An example of the method for forming the electron transport layer from the solution that can be listed includes a film formation method similar to the method for forming the hole transport layer from the solution described above.

With regard to a film thickness of the electron transport layer, the optimum value thereof is different in accordance with the material to be used, and the film thickness may be selected such that the drive voltage and the light emission efficiency have appropriate values. The minimum film thickness can be determined from conditions of the film thickness which prevents at least the occurrence of a pinhole. From the viewpoint that an excessively thick film thickness disadvantageously increases the drive voltage of the element, the maximum film thickness can be determined. Accordingly, the film thickness of the electron transport layer is, e.g., in the range of 1 nm to 1 µm, preferably 2 nm to 500 nm, and more preferably 5 nm to 200 nm.

The electron injection layer is provided between the electron transport layer and the negative electrode, or between the light emitting layer and the negative electrode. Examples of the electron injection layer that can be listed include, in accordance with the type of the light emitting layer, an alkali metal, an alkali earth metal, an alloy containing one or more metals described above, oxides, halides, and carbonates of the above-described metals, and a mixture of the above-described substances. Examples of the alkali metal or its oxide, halide, and carbonate that can be listed include lithium, sodium, potassium, rubidium, cesium, lithium oxide, and lithium fluoride. Additionally, examples thereof include sodium oxide, sodium fluoride, potassium oxide, potassium fluoride, rubidium oxide, rubidium fluoride, cesium oxide, cesium fluoride, and lithium carbonate.

In addition, examples of the alkali earth metal or its oxide, halide, and carbonate that can be listed include magnesium, calcium, barium, strontium, magnesium oxide, magnesium fluoride, calcium oxide, and calcium fluoride. Additionally, examples thereof include barium oxide, barium fluoride, strontium oxide, strontium fluoride, and magnesium carbonate.

The electron injection layer may be the one obtained by laminating two or more layers. A specific example thereof that can be listed includes LiF/Ca or the like. The electron injection layer is formed by the vapor deposition method, the sputtering method, and the printing method. A film thickness of the electron injection layer is preferably in the range of about 1 nm to about 1 µm.

As a material for the negative electrode used in the organic EL element of the present embodiment, a material of which the work function is low and with which the electron injection into the light emitting layer is easily performed, and/or of which the electrical conductivity is high, and/or of which reflectance of visible light is high is preferable. As the metal, there can be used the alkali metal or the alkali earth metal, and a transition metal or a Group III-B metal. Examples of the metal include lithium, sodium, potassium, rubidium, cesium, beryllium, magnesium, calcium, strontium, barium, aluminum, and scandium. Further, examples thereof may include metals such as vanadium, zinc, yttrium, indium, cerium, samarium, europium, terbium, and ytterbium. There are used these metals; an alloy formed of two or more of the above-described metals; an alloy formed of one or more of the above-described metals and one or more of gold, silver, platinum, copper, manganese, titanium, cobalt, nickel, tungsten, and tin; graphite; and a graphite interlayer compound.

Examples of the alloy that can be listed include a magnesium-silver alloy, a magnesium-indium alloy, a magnesium-aluminum alloy, an indium-silver alloy, a lithium-aluminum alloy, a lithium-magnesium alloy, a lithium-indium alloy, and a calcium-aluminum alloy. In addition, a transparent conductive electrode can be used as the negative electrode and, for example, a conductive metal oxide or a conductive organic substance can be used. Specifically, there may be used indium oxide, zinc oxide, tin oxide, and indium tin oxide (ITO) or indium zinc oxide (IZO) which is a composite of the above-mentioned metals as the conductive metal oxides; and organic transparent conductive films such as polyaniline or its derivative, and polythiophene or its derivative as the conductive organic substances. It is to be noted that the negative electrode may be formed to have a multilayer structure with two or more layers. It is to be noted that there are cases where the electron injection layer is used as the negative electrode.

A film thickness of the negative electrode can be appropriately selected in consideration of the electrical conductivity or durability, and the film thickness thereof is, e.g., in the range of 10 nm to 10 μm, preferably 20 nm to 1 μm, and more preferably 50 nm to 500 nm. As the manufacturing method of the negative electrode, there is used the vacuum vapor deposition method, the sputtering method, or a laminating method in which metal thin films are bonded together by thermocompression bonding.

The insulating layer with the film thickness of not more than 2 nm which can be arbitrarily held by the organic EL element of the present embodiment has a function of facilitating the electron injection. Examples of a material for the above-described insulating layer that can be listed include a metal fluoride, the metal oxide, and an organic insulating material. Examples of the organic EL element provided with the insulating layer with the film thickness of not more than 2 nm that can be listed include the one provided with the insulating layer with the film thickness of not more than 2 nm adjacent to the negative electrode, and the one provided with the insulating layer with the film thickness of not more than 2 nm adjacent to the positive electrode.

The organic EL element of the present embodiment can be used as a planar light source, a segment display device, a dot matrix display device, and a back light for a liquid crystal display device. In order to obtain the planar light source by using the organic EL element of the present embodiment, planar positive and negative electrodes may be disposed so as to overlap each other.

In addition, in order to obtain a light source in a pattern configuration, there are available a method in which a mask provided with a window in the pattern configuration is disposed on the surface of the planar light emitting element described above, a method in which an organic substance layer of a non-light-emitting portion is formed to be extremely thick to bring the portion into a substantially non-light-emitting state, and a method in which either one or both of positive and negative electrodes are formed into the pattern configuration. By forming the pattern using either one of these methods, and disposing several electrodes such that they can be turned ON/OFF independently of each other, a segment-type display element capable of displaying numerics, characters, simple symbols, and the like can be obtained.

Further, in order to provide the dot matrix element, the positive and negative electrodes may be appropriately formed into a stripe configuration, and disposed so as to be perpendicular to each other. A method for separately applying a plurality of light emitting materials having different colors of emitted light, or a method using a color filter or a fluorescence conversion filter allows partial color display and multi-color display. The dot matrix element is also capable of passive drive, and may be made capable of active drive by combination with a TFT or the like. These display elements can be used as display devices for a computer, a television, a PDA, a cellular phone, a car navigation system, a view finder of a video camera, and the like.

The invention claimed is:

1. A method of producing a thin film active element, comprising the steps of:
    forming a light-shielding conductive layer on a light-permeable substrate;
    forming a light-permeable conductive layer in a region adjacent to the light-shielding conductive layer so as to overlap at least a side of a part in the light-shielding conductive layer;
    forming a photoresist film covering the light-permeable conductive layer;
    exposing the photoresist film using the light-shielding conductive layer as a light-shielding mask from a direction of the substrate;
    forming a mask pattern by developing the photoresist film such that the region of the exposed photoresist film remains;
    performing etching until the light-shielding conductive layer and the light-permeable conductive layer are spaced apart from each other by overetching the light-permeable conductive layer using the mask pattern as a mask until an etching species comes under the mask; and
    forming a channel layer functioning as a carrier region of the active element in a gap between the light-permeable conductive layer and light-shielding conductive layer which are spaced apart from each other.

2. The method of producing a thin film active element of claim 1, further comprising the step of:
    forming a light-permeable gate electrode and a light-permeable gate insulating film on the substrate before forming the light-shielding conductive layer.

3. The method of producing a thin film active element of claim 1, further comprising the step of:
    forming a gate insulating film and a gate electrode after forming the channel layer.

4. The method of producing a thin film active element of claim 1, wherein the light-permeable conductive layer is overetched by using a wet etching method in the step of performing etching until the light-shielding conductive layer and the light-permeable conductive layer are spaced apart from each other.

5. The method of producing a thin film active element of claim 1, wherein the light-permeable conductive layer is overetched by using a plasma etching method which generates, as the etching species, a halogen-based radical or ion, or an oxygen-based radical or ion in the step of performing etching until the light-shielding conductive layer and the light-permeable conductive layer are spaced apart from each other.

* * * * *